United States Patent
Papadopoulos et al.

(10) Patent No.: US 10,468,321 B2
(45) Date of Patent: Nov. 5, 2019

(54) POWER SEMICONDUCTOR DEVICE AND METHOD FOR MANUFACTURING SUCH A POWER SEMICONDUCTOR DEVICE

(71) Applicant: ABB Schweiz AG, Baden (CH)

(72) Inventors: Charalampos Papadopoulos, Lenzburg (CH); Munaf Rahimo, Uezwil (CH)

(73) Assignee: ABB Schweiz AG, Baden (CH)

( * ) Notice: Subject to any disclaimer, the term of this patent is extended or adjusted under 35 U.S.C. 154(b) by 21 days.

(21) Appl. No.: 15/677,625

(22) Filed: Aug. 15, 2017

(65) Prior Publication Data
US 2018/0047652 A1    Feb. 15, 2018

(30) Foreign Application Priority Data
Aug. 15, 2016    (EP) .................................. 16184202

(51) Int. Cl.
| H01L 23/31 | (2006.01) |
| H01L 21/02 | (2006.01) |
| H01L 29/40 | (2006.01) |
| H01L 29/78 | (2006.01) |
| H01L 29/06 | (2006.01) |
| H01L 29/66 | (2006.01) |
| H01L 29/739 | (2006.01) |
| H01L 29/861 | (2006.01) |
| H01L 29/16 | (2006.01) |

(52) U.S. Cl.
CPC ...... *H01L 23/3171* (2013.01); *H01L 21/0217* (2013.01); *H01L 21/02167* (2013.01); *H01L 23/3192* (2013.01); *H01L 29/0615* (2013.01); *H01L 29/0619* (2013.01); *H01L 29/1608* (2013.01); *H01L 29/408* (2013.01); *H01L 29/6606* (2013.01); *H01L 29/739* (2013.01); *H01L 29/7395* (2013.01); *H01L 29/7811* (2013.01); *H01L 29/8611* (2013.01)

(58) Field of Classification Search
CPC .......... H01L 29/7811; H01L 29/66053; H01L 29/6606; H01L 29/408; H01L 23/3171; H01L 23/3192; H01L 21/0217
See application file for complete search history.

(56) References Cited

U.S. PATENT DOCUMENTS 9,761,438 B1 * 9/2017 Chu ...................... H01L 23/291
2006/0118792 A1 * 6/2006 Ryu ..................... H01L 21/0445
257/77

(Continued)

OTHER PUBLICATIONS

European Search Report, EP 16184202.6, ABB Schweiz AG, dated Jan. 30, 2017, 6 pages.

*Primary Examiner* — David C Spalla
(74) *Attorney, Agent, or Firm* — Taft Stettinius & Hollister LLP; J. Bruce Schelkopf

(57) ABSTRACT

A power semiconductor device is provided comprising a wafer, wherein in a termination region of the device a passivation layer structure is formed at least on a portion of a surface of the wafer and the passivation layer structure comprises in an order from the surface of the wafer in a direction away from the wafer a semi-insulating layer, a silicon nitride layer, an undoped silicate glass layer and an organic dielectric layer. The silicon nitride layer has a layer thickness of at least 0.5 µm. The organic dielectric layer its attached to the undoped silicate glass layer and the undoped silicate glass layer is attached to the silicon nitride layer.

20 Claims, 6 Drawing Sheets

(56) References Cited

U.S. PATENT DOCUMENTS

| | | |
|---|---|---|
| 2006/0226479 A1 | 10/2006 | Tu et al. |
| 2007/0111469 A1* | 5/2007 | Kim .................. H01L 21/28114 438/424 |
| 2014/0061733 A1* | 3/2014 | Schmidt ............ H01L 21/02203 257/288 |
| 2015/0028382 A1 | 1/2015 | von Arx |

* cited by examiner

POWER SEMICONDUCTOR DEVICE AND METHOD FOR MANUFACTURING SUCH A POWER SEMICONDUCTOR DEVICE

TECHNICAL FIELD

The invention relates to the field of power electronics and more particularly to a power semiconductor device according to the claim 1 and a method for manufacturing such a power semiconductor device according to the claim 8.

BACKGROUND ART

Power semiconductor devices require an efficient edge termination to avoid electric field crowding at the edge of the main contact resulting in breakdown of the device at a relatively low breakdown voltage ($V_{BR}$). Common power semiconductor devices, such as a pin diode or an insulated-gate bipolar transistor (IGBT) usually have a planar edge termination in order to achieve a breakdown voltage in the range of 80 to 90% of the ideal one-dimensional diode breakdown voltage. Known planar edge termination techniques include junction termination extension (JTE), variation of lateral doping (VLD) layers and floating field ring terminations (FFR) with or without field plate extensions. Another type of edge termination structure is a beveled termination structure. By beveling a defined angle is formed between a lateral p-n junction and the surface of the wafer, and thereby the edge is relieved from high electric fields.

Especially the surface of a semiconductor device is very sensitive to high electric fields. To obtain a well-defined surface and to terminate free bonds at the surface of the wafer a passivation layer stack is formed above the edge termination structure on the surface of the wafer. Semi-insulating and insulating materials are used for the passivation layer structure. Common insulating passivation layers include organic passivation layers such as a silicone rubber layer or a polyimide (PI) layer, and inorganic passivation layers, such as a silicon dioxide ($SiO_2$) layer or glass layers, which consist of $SiO_2$ and additional elements. However, some ions such as sodium (Na) and potassium (K) ions are known to migrate through the oxide layers resulting in instability of the breakdown voltage. To prevent the migration of ions and avoid instability of the breakdown voltage it is known to cover the oxide layers by a silicon nitride ($Si_3N_4$) or oxynitride ($SiO_xN_y$) layer acting as a diffusion barrier. Undoped silicon dioxide proved to be a brittle material and so phosphorous was added to it to strengthen the material. In addition in phosphosilicate glass (PSG) and boron phosphosilicate glass (BPSG) the phosphorous forms traps for ions and therefore improves the protection provided by the silicon oxide layer against ionic contaminations.

Besides insulating passivation layers semi-insulating layers, such as semi-insulating polycrystalline silicon (SIPOS) layers, are sometimes used as a combined passivation and edge termination. By adjusting the electric conductivity of a semi-insulating layer, a continuous decrease of the potential at the surface can be achieved. The conductivity of a SIPOS layer can be controlled by adjusting its oxygen content.

In power semiconductor modules a silicone gel is often used to protect the power semiconductor chips or wafers from harsh environmental conditions (moisture, in particular) and to provide electrical insulation for high voltage operation. The silicone gel fills all the gaps between the housing of the semiconductor module and the device wafer.

Besides the performance of the power semiconductor devices immediately after the manufacturing process, robustness and long term reliability under environmental conditions of its intended use are of utmost importance. More and more emphasis has been given to robustness and long term stability in high humidity environment. Common stress tests for evaluating the robustness and long term reliability under harsh environmental conditions are the temperature-humidity-bias (THB) test and the highly accelerated temperature and humidity stress test (HAST). As higher the voltage during the test, as higher the degradation acceleration of the passivation and the termination capability. The high electric field in the passivation materials in combination with high temperature and high humidity causes degradation of the materials due to corrosion and sparking events. This leads in the end to an electrical and mechanical degradation of the device termination. For example a silicon nitride layer may react with moisture and get oxidized. During corrosion of the silicon nitride, nitrogen gas is formed which may lift any layer above the silicon nitride layer. Also the corrosion creates a less dense silicon nitride layer with a porous structure resulting in a degraded performance as a passivation layer, as it has a degraded capability filtering the field towards an insulating material, in which a semiconductor device is embedded (exemplarily a gel) and could crack. In case of using aluminum below the silicon nitride layer, humidity may penetrate towards the aluminum through the degenerated silicon nitride layer. The electric field causes that the aluminum corrodes to an aluminum oxide which is growing in mass and cracking the whole termination and passivation structure. The passivation, cannot act anymore properly due to the corrosion and as a result the leakage current is rising until catastrophic breakdown of the power semiconductor device. An additional degradation is caused, when aluminium layers in the termination region like field plates or gate runner grow to aluminium oxide and destroy the passivation above. It needs several hours of high temperature for drying, to get moisture out of the device. With a higher voltage class the electrical field is also stronger and corrosion is accelerated accordingly. For SiC devices, ten times higher fields are allowed in the bulk, as compared to silicon. This imposes difficult challenges especially for SiC power semiconductor devices.

In prior art document US 2014/0061733 A1 there is described a semiconductor device comprising a semiconductor body and a passivation layer stack formed on a surface of the semiconductor body. The passivation layer stack includes an amorphous semi-insulating layer on the surface of the semiconductor body, a first nitride layer on the amorphous semi-insulating layer, an intermediate layer on the first nitride layer and a second nitride layer on the intermediate layer. The intermediate layer may include silicate glass, such as an undoped silicate glass (USG), a phosphorous doped silicate glass (PSG), a boron doped silicate glass (BSG), or a boron and phosphorous doped silicate glass (BPSG). However, there are no means provided in the semiconductor device disclosed in this prior art document which would block flow of humidity towards the top second nitride layer.

In US 2006/226479 A1 a semiconductor device is shown having a passivation layer stack in the following order away from the semiconductor wafer: dielectric layer, silicon glass layer, silicon nitride or oxide layer. The silicon glass layer arranged on top of the dielectric layer neutralizes or reduces the dipole effect or removes surface charges at the interface of the dielectric layer.

DISCLOSURE OF INVENTION

It is an object of the invention to provide a power semiconductor device having a passivation layer structure, which is robust and has long term reliability in high humidity.

The object of the invention is attained by a power semiconductor device according to claim 1.

In the inventive semiconductor device, a semiconductor wafer is provided, which may be made of silicon or a wide bandgap material like silicon carbide. First a semi-insulating layer is arranged on the wafer followed by a silicon nitride layer, which protects the substrate chemically and mechanically. The silicon nitride layer is attached to and thereby covered by an undoped silicate glass layer and, on top of it, an organic dielectric layer.

In the power semiconductor device of the invention a semi-insulating layer, a silicon nitride layer, and an organic dielectric layer provide an efficient passivation.

The undoped silicate glass layer between the silicon nitride layer and the organic dielectric layer acts as a barrier for the flow of humidity towards the silicon nitride layer. While other silicon oxide layers such as PSG or BPSG do not efficiently block humidity, the undoped silicate glass layer is especially efficient to block the humidity. Also, in the passivation layer stack of the invention there is no silicon nitride layer between the organic dielectric layer and the undoped silicate glass layer. In other words any silicon nitride layer is below the undoped silicate glass layer above, i.e. the uppermost silicon nitride layer, which is such silicon nitride layer, which is farest away from the wafer, is covered by an undoped silicate glass layer. Thus, the undoped silicate glass layer protects the silicon nitride layer towards the top side. Accordingly, any humidity coming from the organic dielectric layer has to pass the undoped silicate glass layer before coming into contact with a silicon nitride layer avoiding degeneration due to corrosion and degeneration of a silicon nitride layer. In the prior art an organic layer is often used to block humidity. However, the inventors found out that humidity is not only coming from outside of the device but can also be stored in the organic layer and, therefore, come from the organic layer itself.

An undoped silicate glass layer can block humidity efficiently. Doped silicate glass layers would take up more moisture, which lead to moisture effects as described above for the prior art devices. In prior art devices the dopant in doped silicate glass layers may form an acid with moisture (e.g. phosphor acid), which acts aggressively with the termination structures. Furthermore, an undoped silicate glass layer comprises hydrogen, which captures ions (i.e. gettering effect) due to the hydrogen in the undoped silicate glass layer.

The organic dielectric layer ensures a good adherance on the undoped silicate glass layer due to the OH— bonds present in the undoped silicate glass layer. Such OH— bonds are not available in nitride layers or doped silicon oxide layers so that in prior art devices the layers are less reliable joined to each other.

A silicon nitride layer of at least 0.5 µm ensures an efficient charge blocking. Without the silicon nitride layer between the wafer and the undoped silicate glass layer, the undoped silicate glass layer would uptake positive charges, thereby contradicting the purpose of the passivation layer. Therefore, the silicon nitride layer is introduced below the undoped silicate glass layer.

In an exemplary embodiments the silicon nitride layer has a layer thickness of at least 0.7 µm or of at least 0.9 µm. In this embodiments the passivation function of the silicon nitride layer is efficient and preventing humidity from coming into contact with the silicon nitride layer becomes especially important with increasing thickness of the silicon nitride layer.

On top of the undoped silicate glass layer, no additional nitride layer is arranged to avoid any moisture effects like nitride corrosion. Thus, the silicon nitride layer is arranged between the undoped silicate glass layer and the wafer, which silicon nitride layer is protected against humidity by the undoped silicate glass layer.

Further preferred embodiments of the inventive subject matter are disclosed in the dependent claims.

In an exemplary embodiment the silicate glass layer has a layer thickness of at least 0.4 µm or at least 0.5 µm. The blocking function of the silicate glass layer increases with increasing thickness. With a thickness above 0.4 µm the silicate glass layer can efficiently block humidity.

In an exemplary embodiment the organic dielectric layer includes at least one of a polyimide layer, a polybenzoxazole layer and a silicone layer. These organic dielectric layers can efficiently block humidity coming from outside, while the undoped silicate glass layer blocks humidity, which may be stored in any one of these organic dielectric layers.

In an exemplary embodiment the semi-insulating layer is a semi-insulating polycrystalline silicon layer, an amorphous silicon layer, an amorphous silicon nitride layer or a diamond-like carbon layer.

The organic dielectric layer is in direct contact with the undoped silicate glass layer. The organic dielectric layer has a good adhesion to the undoped silicate glass layer directly below. The adhesion between the undoped silicate glass layer is improved compared to a direct contact between the organic dielectric layer and a silicon nitride layer.

The power semiconductor device according to the invention may be manufactured by a method according to claim 8.

In an exemplary embodiment the step of forming the silicon nitride layer includes a first step of forming a first silicon nitride layer at a temperature above 500° C. and a second step of forming a second silicon nitride layer at a temperature below 500° C. (the temperature being the maximum temperature at the wafer). Forming the first silicon nitride layer at a temperature above 500° C. results in a high quality nitride layer, while forming the second nitride layer at a wafer temperature below 500° C., exemplarily below 425° C., can be performed with a high growth rate. In this manner a thick silicon nitride layer with a high quality portion close to the wafer, where the quality of the silicon nitride layer matters most, can be obtained.

In exemplary embodiments of the method for manufacturing the power semiconductor device according to the invention the first silicon nitride layer is formed by low pressure chemical vapour deposition or sputtering.

In exemplary embodiments of the method for manufacturing the power semiconductor device according to the invention the second silicon nitride layer is formed by plasma enhanced chemical vapour deposition or sputtering.

In exemplary embodiments of the method for manufacturing the power semiconductor device according to the invention the second silicon nitride layer has a layer thickness of at least 0.5 µm or of at least 0.7 µm or of at least 0.9 µm.

In exemplary embodiments of the method for manufacturing the power semiconductor device according to the invention the undoped silicate glass layer is formed by plasma enhanced chemical vapour deposition or sputtering at a temperature below 500° C.

In exemplary embodiments of the method for manufacturing the power semiconductor device according to the invention the silicon nitride layer and the undoped silicate glass layer are selectively etched using a single masking layer, which is the same masking layer for the silicon nitride layer, exemplarily the first and second silicon nitride layer, and the undoped silicate glass layer. This ensures that the whole silicon nitride layer is covered by the undoped silicate glass layer to block humidity towards the silicon nitride layer most efficiently.

BRIEF DESCRIPTION OF DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF PREFERRED EMBODIMENTS

Figure 1:
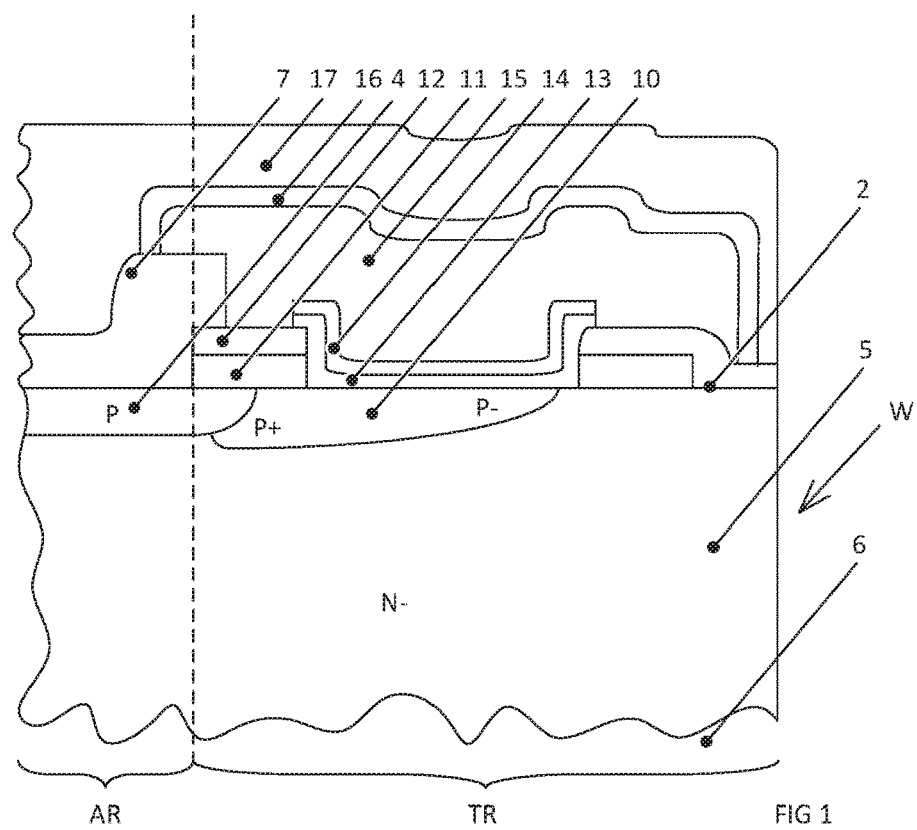
FIG. 1 shows a partial cross sectional view of a termination structure according to an embodiment of the invention.

In FIG. 1 there is shown a termination structure as an embodiment of the power semiconductor device of the invention. A semiconductor wafer W is exemplarily made of SiC. It has a first main side 2 and a second main side 3, which is parallel to the first main side surface and extending in a lateral direction. The semiconductor wafer W has an active region AR and a termination region TR laterally surrounding the active region AR. The active region is the region, in which the electric field is actively controlled, whereas in the termination region the electric field is reduced towards the edge of the device.

Figure 10:
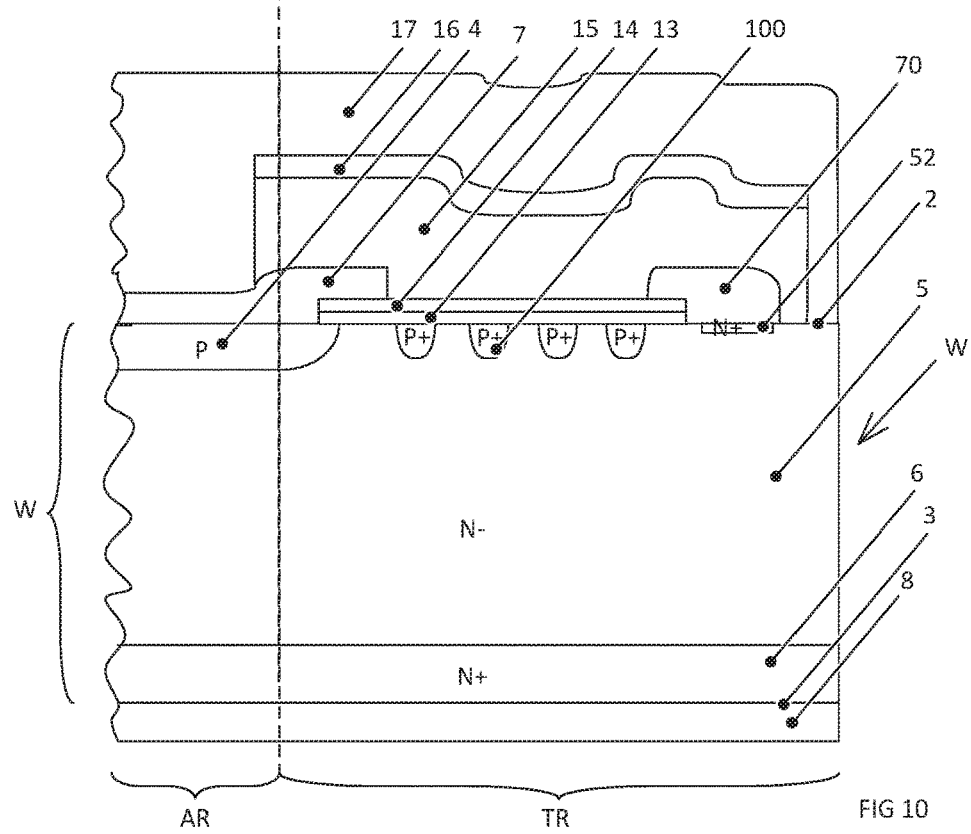
FIG. 10 shows a partial cross sectional view of a diode according to another embodiment of the invention.

FIG. 10 shows a pin diode 1 as an embodiment of the power semiconductor device of the invention. In the order from the first main side 2 to the second main side 3, the semiconductor wafer W comprises a p-doped anode layer 4, an n$^-$-doped drift layer 5, and an n$^+$-doped cathode layer 6 having a doping concentration higher than that of the n$^-$-doped drift layer 5. Exemplarily the doping concentration of the cathode layer is $5 \cdot 10^{18}$ cm$^{-3}$ or more. The doping concentration of the anode layer 4 is exemplarily $5 \cdot 10^{16}$ cm$^{-3}$ or more. The drift layer 5 is in direct contact with the anode layer 4 to form a main pn-junction. An anode electrode 7 is formed on the first main side 2 to form an ohmic contact with the anode layer 4. On the second main side 3 of the semiconductor wafer W there is formed a cathode electrode 8 to form an ohmic contact with the cathode layer 6. Depending on the voltage class of the power semiconductor device the thickness of the drift layer 5 may exemplarily vary in a range between 30 to 400 µm.

Exemplarily, a plurality of p$^+$-doped floating field rings is arranged in the termination region TR (FIGS. 10 and 11) adjacent to the first main side surface of the wafer W. Each one of the floating field rings is ring-shaped and laterally surrounds the active region AR and the anode layer. Also, each floating field ring 100 is in direct contact with the drift layer 5 to form a pn-junction. Exemplarily, the floating field rings 100 have a peak doping concentration in a range between $1 \cdot 10^{17}$ cm$^{-3}$ and $1 \cdot 10^{19}$ cm$^{-3}$, exemplarily between $1 \cdot 10^{18}$ cm$^{-3}$ and $1 \cdot 10^{19}$ cm$^{-3}$. The number of floating field rings in the edge termination structure may vary dependent on the voltage class of the high power semiconductor device and depending on the depth of the floating field rings. The total number of floating field rings may be up to 200.

Figure 11:
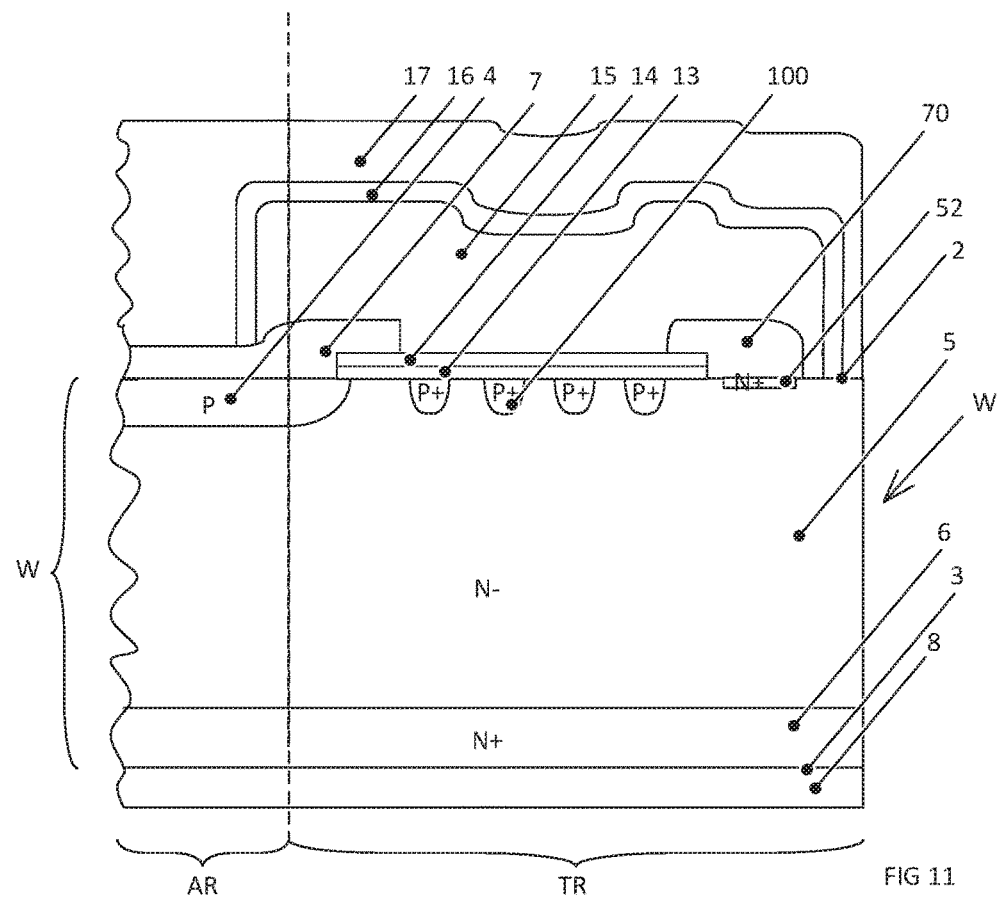
FIG. 11 shows a partial cross sectional view of another diode according to another embodiment of the invention.

As shown in FIG. 11, the power device may exemplarily comprise in the termination region TR on the first main side 2 a field stop layer 52 with an n+ implant and/or a field stop plate. The field stop layer 52 may be contacted to an electrode 70. Electrode 70 may cover the outer edge of staple of silicon dioxide layer 11 and PSG layer 12 described below.

In another embodiment, in the termination region TR, adjacent to its first main side 2, the semiconductor wafer W may have a variation of lateral doping (VLD) region 10 directly adjacent to, i.e. with direct contact to, the anode layer 4 (shown in FIG. 1). In the VLD region is a p$^-$-doped zone, in which the doping is decreasing outward to the device edge (right side in FIG. 1) and which is in direct contact, i.e. directly adjacent to the p-doped anode layer. Towards the outer edge of the termination region TR (towards the right side in FIG. 1) the VLD region has a decreasing doping concentration and a decreasing depth as shown in FIG. 1. Alternatively or additionally to the VLD regions in the termination region, the device may also comprise other termination structures like junction termination extension (JTE) and floating field ring terminations (FFR) 100, which are shown in FIGS. 10 and 11 with and without field plate extensions.

In the termination region TR there is arranged a passivation layer structure on the first main side 2 surface of the semiconductor wafer W. The passivation layer stack comprises in an order from the first main side 2 in a direction away from the semiconductor wafer W a semi-insulating layer 13, a silicon nitride layer, an undoped silicate glass layer 16 and an organic dielectric layer 17. The semi-insulating layer 13 is exemplarily a semi-insulating polycrystalline silicon (SIPOS) layer or an amorphous silicon layer or an amorphous silicon nitride layer or a diamond-like carbon layer.

The silicon nitride layer may exemplarily comprise a first silicon nitride layer 14 and a second nitride layer 15. The first silicon nitride layer 14 is a high temperature silicon nitride layer formed by LPCVD or sputtering at a temperature of more than 500° C. Due to the high wafer temperature during deposition the first silicon nitride layer 14 has a high crystalline quality. A layer thickness of the first silicon nitride layer 14 is exemplarily in a range between 50 nm and 400 nm, exemplarily up to 200 nm. The second silicon nitride layer 15 arranged on the first silicon nitride layer 14 is a low temperature silicon nitride layer deposited at a wafer temperature below 500° C., exemplarily below 425° C. A layer thickness of the second silicon nitride layer 15 is exemplarily at least 0.5 µm, or is at least 0.7 µm or is at least 0.9 µm. The second silicon nitride layer 15 may have in an exemplary embodiment a thickness of at most 2 µm or at most 1.6 µm. Exemplarily, the thickness of the first silicon nitride layer 14 together with the thickness of the second silicon nitride layer 15 is at least 550 nm.

An undoped silicate glass (USG) layer 16 is arranged on the second silicon nitride layer 15 and attached to it. and the USG layer 16 has exemplarily a thickness of at least 0.4 µm, exemplarily at least 1 µm. The undoped silicate glass layer 16 covers and thereby protects the second silicon nitride layer 15 from the top side (side facing away from the wafer W) and from the lateral sides (perpendicular to the first main side 2) as shown in FIG. 1 and FIG. 11 for the pin diode. This gives a very good protection to all sides. Alternatively, the undoped silicate glass layer 16 may cover the second silicon nitride layer 15 only from the top side, but laterally be terminated together at the same distance, so that the lateral sides of the second silicon nitride layer 15 are not projected by the undoped silicate glass layer 16 (FIG. 10). Such a structure is easy to manufacture as both undoped silicate glass layer 16 and second silicon nitride layer 15 can be created using a single mask and as only the lateral sides of the second silicon nitride layer 15 are uncovered, the influence concerning humidity protection is acceptable.

The organic dielectric layer 17 arranged on the undoped silicate glass layer 16 is exemplarily a polyimide (PI) layer or a polybenzoxazole layer or a silicone layer or any combination thereof. A thickness of the organic dielectric layer 17 is exemplarily in a range between 1 µm and 5 µm.

In a transition region between the active region AR and the termination region TR and at an outer edge of the termination region (i.e. on a right side in FIG. 1) there may be arranged a silicon dioxide layer 11 on the first main surface and on top of the silicon dioxide layer 11 a phosphosilicate glass layer (PSG) 12. The staple of the silicon dioxide layer 11 and the PSG layer 12 has an opening towards the wafer W, in which opening the semi-insulating layer 13 is in direct contact with first main side 2 of semiconductor wafer W. The silicon dioxide layer 11 may be connected to the p anode layer 4 either directly (FIG. 10, 11) or via a p doped layer in the termination region, exemplarily a VLD layer 10, which again is connected to the anode layer 4 (FIG. 1, 14).

Figure 12:
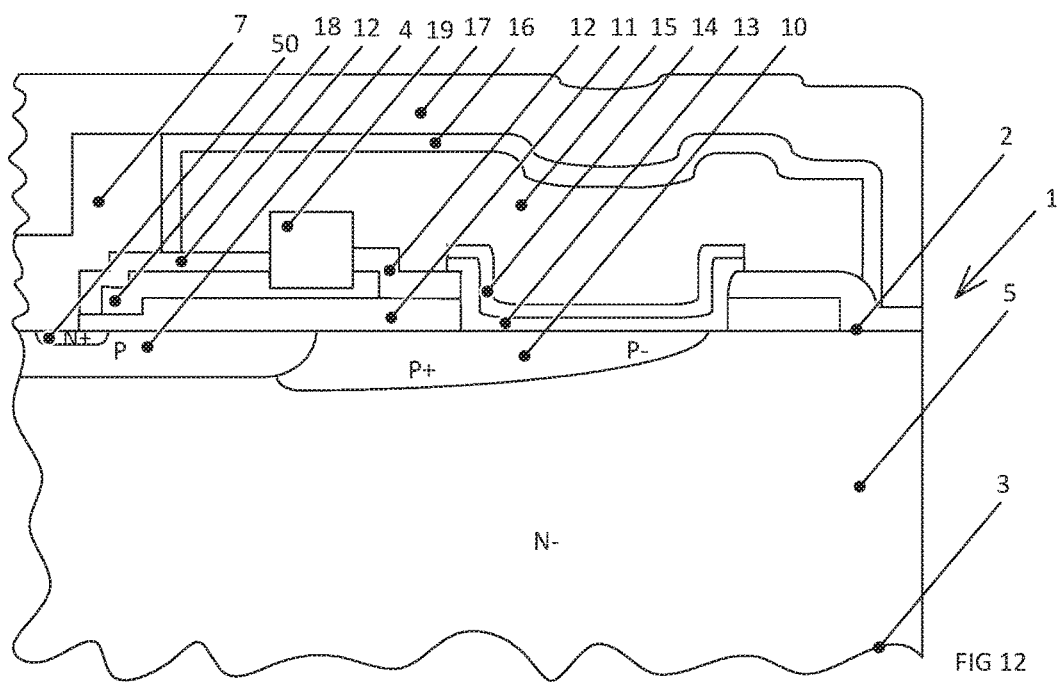
FIG. 12 shows a partial cross sectional view of a MOS device (MOSFET or IGBT) according to another embodiment of the invention.

FIGS. 12 and 13 show an embodiment, in which the silicon dioxide layer 11 and the PSG layer 12 form a common edge to their lateral sides (i.e. formed the same mask). The layers 11, 12 may be designed as plane layers on and parallel to the first main side 2.

FIG. 12 shows a termination structure for a MOS cell as another embodiment of the power semiconductor device of the invention. The MOS cell may belong to a MOSFET, in which on the second main side an n doped layer (which is higher doped than the drift layer 5) is arranged or to an IGBT, in which on the second main side a p doped collector layer is arranged, exemplarily with an n doped buffer layer between the drift and collector layer (backside structures not shown in the figure). The IGBT may have all kind of backside structures like reverse conducting IGBTs, in which n doped regions alternate with the p doped collector layer. The device shown in FIG. 12 comprises a planar gate electrode, in which an electrically conductive gate layer 18 is insulated from the doped layers in the wafer W by an insulating layer, exemplarily a silicon dioxide layer 11. The gate layer 18 is insulated on its top side, i.e. on the side facing away from the wafer W by another insulating layer, exemplarily by a PSG layer. In the termination region TR a gate contact 19 in form of a gate runner may contact the gate layer 18. The gate contact 19 may be made of Aluminum. The gate contact 19 may be covered by the second silicon nitride layer 15 and by the undoped silicate glass layer 16. These layers 15, 16 may also separate the gate contact 19 from the anode electrode 7 (which is in case of the device being an IGBT an emitter electrode or a source electrode in the case of the device being a MOSFET).

The electrode 7 contacts in the active region AR an n doped source layer 50 and the p doped anode layer 4, which may also be called base layer or cathode layer for an IGBT/MOSFET.

Alternatively to a planar gate electrode, the gate electrode may also be formed as a trench gate electrode, in which the gate electrode is arranged in a recess of the wafer, so that it is arranged in the same plane parallel to the first main side 2 as the n doped source layer 50 and the p doped anode layer 4.

The inventive termination structure may be implemented in all kind of semiconductor types, which require such termination structures, i.e. in which the electric field is reduced in the termination region, such as insulated gate bipolar transistors (IGBTs), metal-oxide-semiconductor field-effect transistors (MOSFETs) or diodes.

Next, a method for manufacturing a power semiconductor device according to the invention is explained with reference to the FIGS. 2 to 11. The figures represent only the first main sided structure of the device. On the second main side 3, any design may be realized at any appropriate manufacturing step like forming an n doped layer for a diode or a MOSFET or forming a p doped layer for an IGBT.

Figure 2:
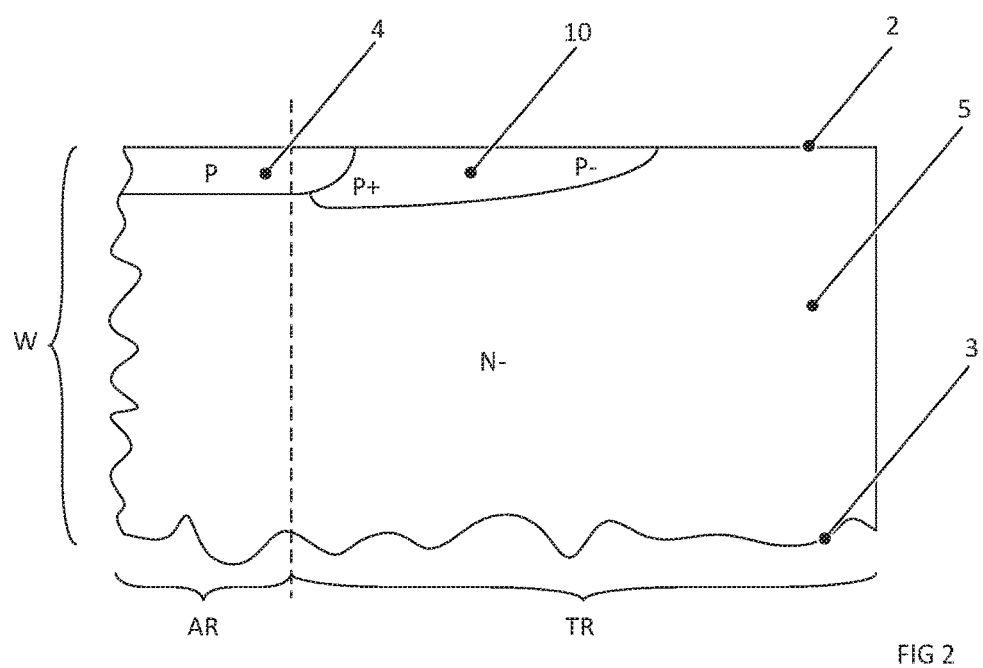
FIGS. 2 to 9 show partial cross sectional views illustrating different steps of a method for manufacturing the power semiconductor device of FIG. 1.
Figure 3:
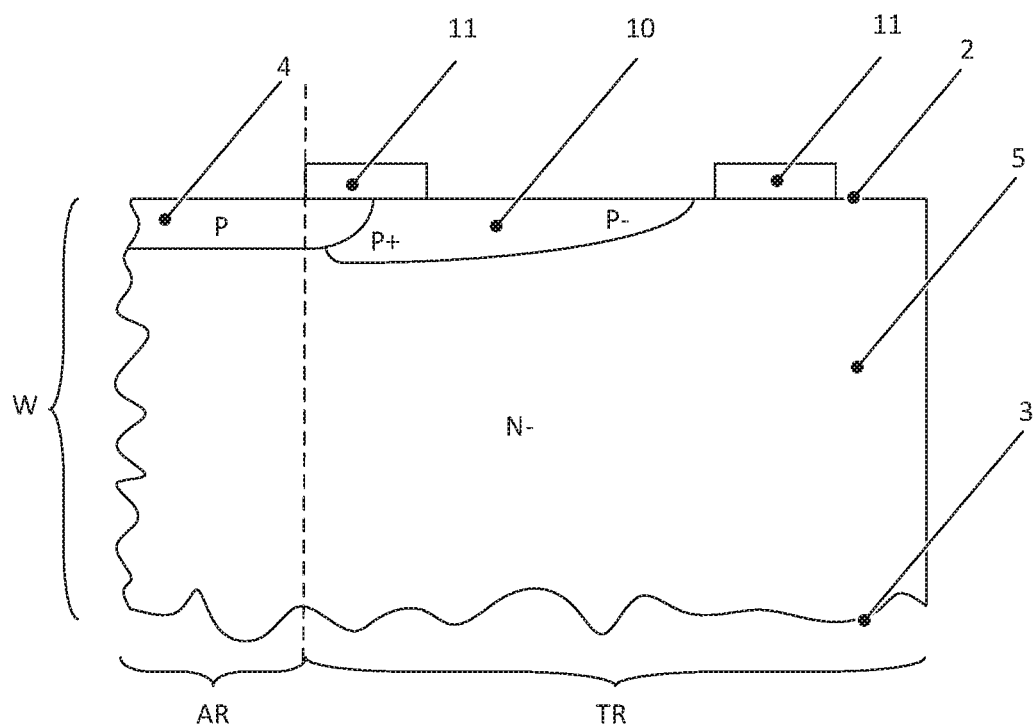

As shown in FIG. 2, a wafer is provided, which may be a Silicon or a wide bandgap wafer, exemplarily a silicon carbide wafer. Layers in the electrically active region of the wafer and in the termination region surrounding the active region may have been created depending on the semiconductor device type. Exemplarily as shown in FIG. 2, in the termination region TR, adjacent to its first main side 2, a variation of lateral doping (VLD) region 10 may be formed directly adjacent to, i.e. with direct contact to, the anode layer 4. However, in the termination region any termination structure known to the persons skilled in the art like may be created like junction termination extension (JTE), variation of lateral doping (VLD) as exemplarily shown in the figures and floating field ring terminations (FFR) 100 (as shown in FIGS. 12 and 13) with and without field plate extensions.

On top of the termination structure a passivation layer structure is formed on at least a portion of a surface of the wafer in the termination region TR, wherein the step of forming the passivation layer structure includes a step of forming a semi-insulating layer 13, a step of forming a silicon nitride layer on the semi-insulating layer 13, a step of forming an undoped silicate glass layer 16 on the silicon nitride layer and a step of forming an organic dielectric layer 17 on the undoped silicate glass layer 16. The silicon nitride layer has a layer thickness of at least 0.5 µm. The organic dielectric layer 17 is attached to the undoped silicate glass layer 16, i.e. no other layer is between the organic dielectric layer 17 and the undoped silicate glass layer 16.

Figure 4:
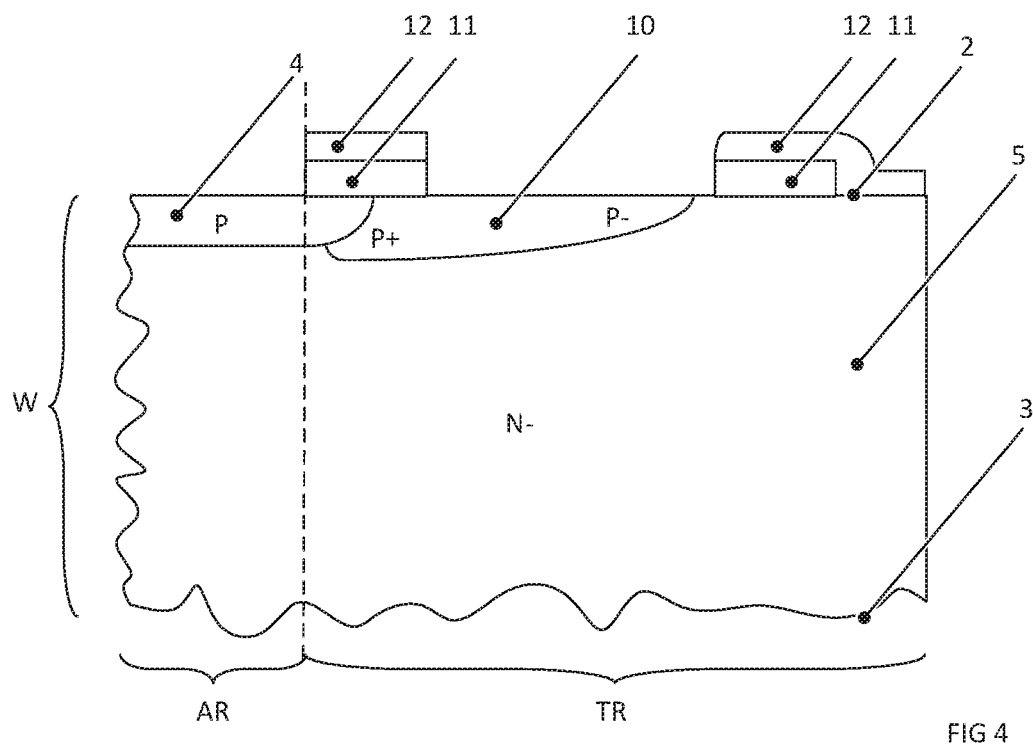
Figure 5:
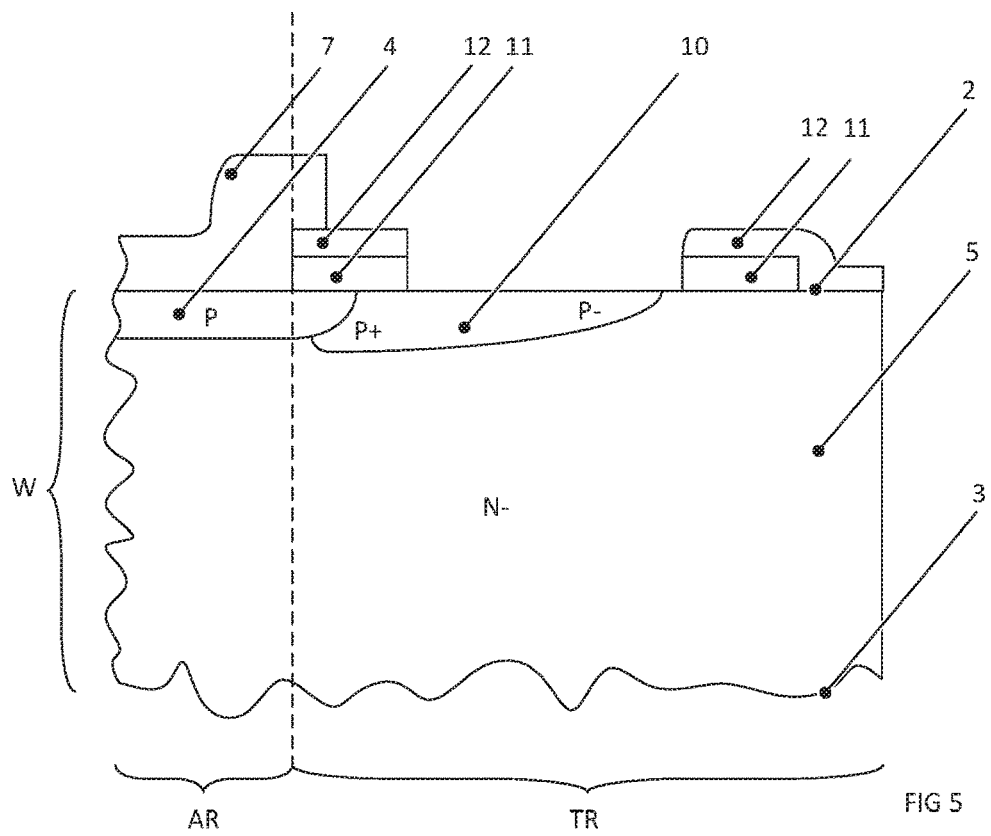
Figure 6:
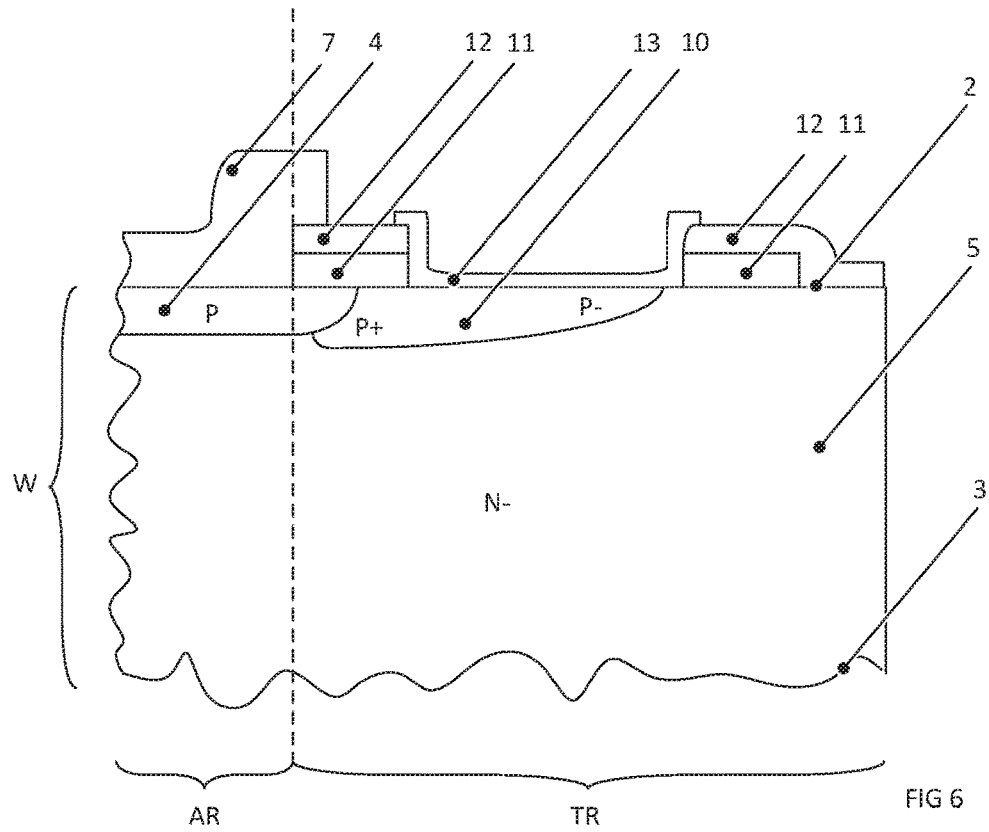
Figure 7:
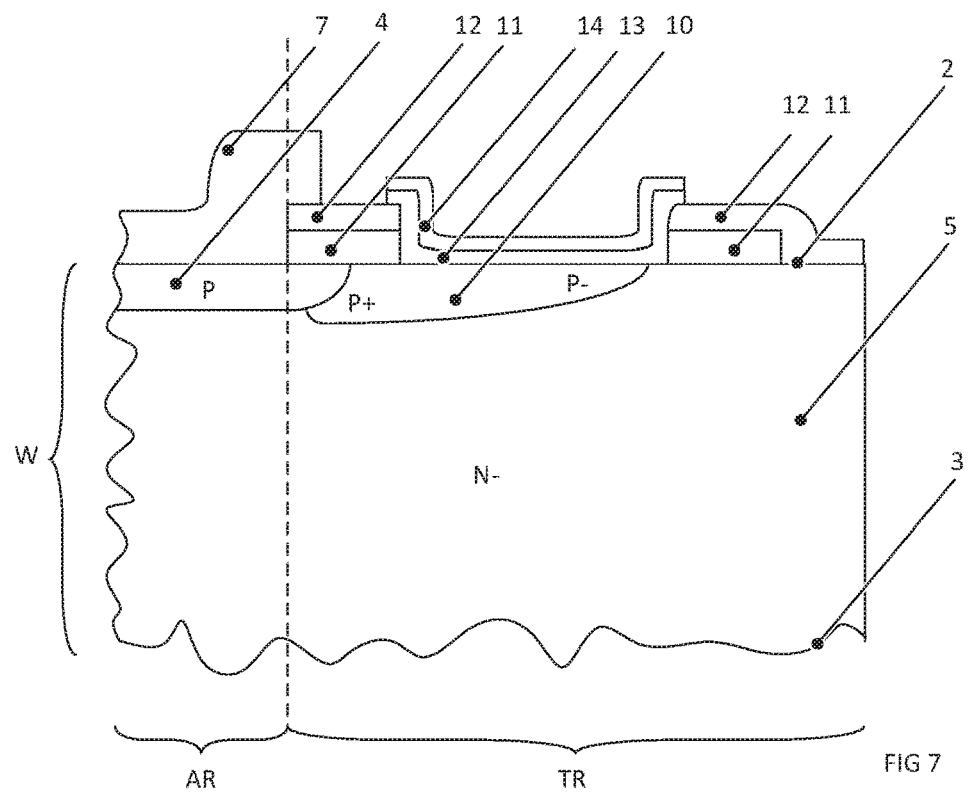

Additionally, there may be formed a silicon dioxide layer 11 on the first main side 2 surface (FIG. 3) and on top of the silicon dioxide layer 11 a phosphosilicate glass layer (PSG) 12 may be formed (FIG. 4). The passivation layer structure may project the silicon dioxide layer 11 and the PSG layer 12 at the opening of the staple. At this opening, the semi-insulating layer 13 is in direct contact with first main side 2 of semiconductor wafer W (FIG. 6).

An electrode may be formed in the active region on the first main side 2 as an anode electrode 7 (FIG. 5), exemplarily before or after the formation of the PSG glass layer 12. On the second main side 3, an electrode may be formed as a cathode electrode 8. The electrode metallization layers 7, 8 may be formed at any appropriate manufacturing step. Another electrode 70 may be formed on the first main side 2 in the termination region TR towards the edge of the device, farer away from the active region AR than the p doped termination layers (e.g. VLD layer 10 or field rings 100) on top of a highly n doped field stop layer 52, which electrode 70 may be formed in the same step and from the same material as the first main electrode 7. The electrode 70 may cover the outer edge of the staple of silicon dioxide layer 11 and PSG layer 12.

Figure 8:
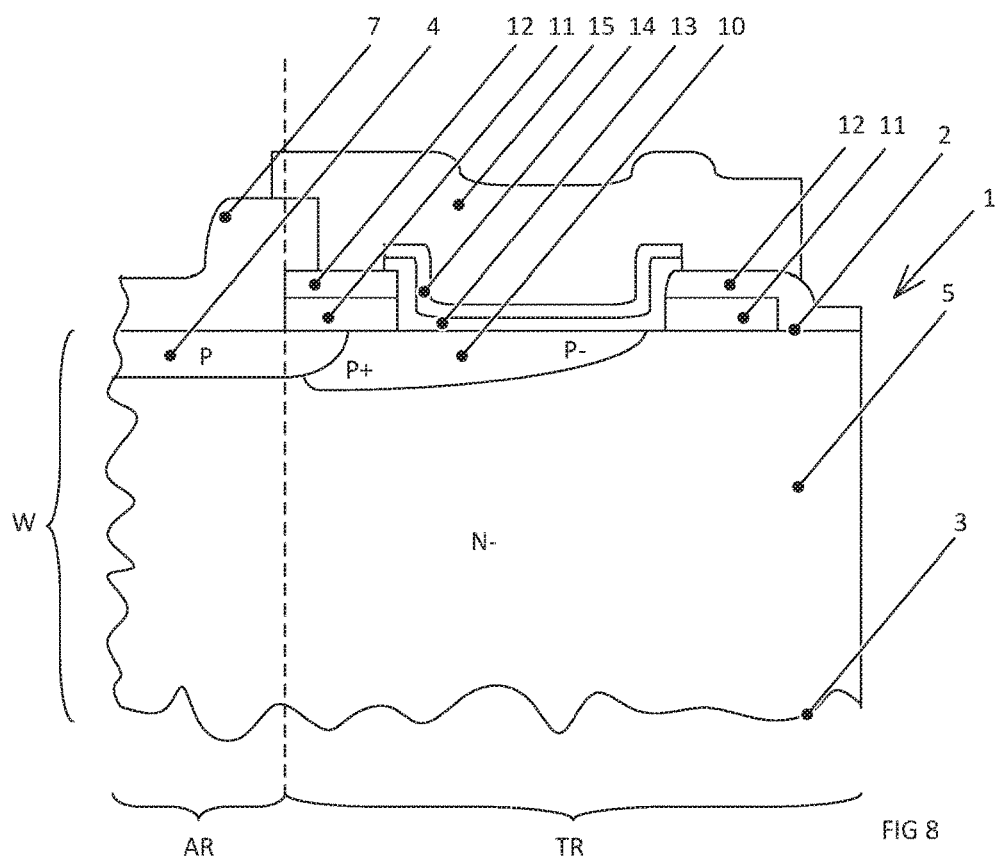

In an exemplary embodiment the step of forming the silicon nitride layer includes a first step of forming a first silicon nitride layer 14 at a temperature above 500° C., exemplarily above 600° C. (FIG. 7) and a second step of forming a second silicon nitride layer 15 at a temperature below 500° C., exemplarily below 425° C. (FIG. 8). Forming the first silicon nitride layer 14 at a temperature above 500° C. results in a high quality nitride layer, while forming the second nitride layer 15 at a temperature below 500° C. can be performed with a high growth rate. In this manner a thick silicon nitride layer with a high quality portion close to the wafer, where the quality of the silicon nitride layer matters most, can be obtained. Exemplarily, the combined thickness of the first and second silicon nitride layers 14, 15 is at least 550 nm.

Figure 9:
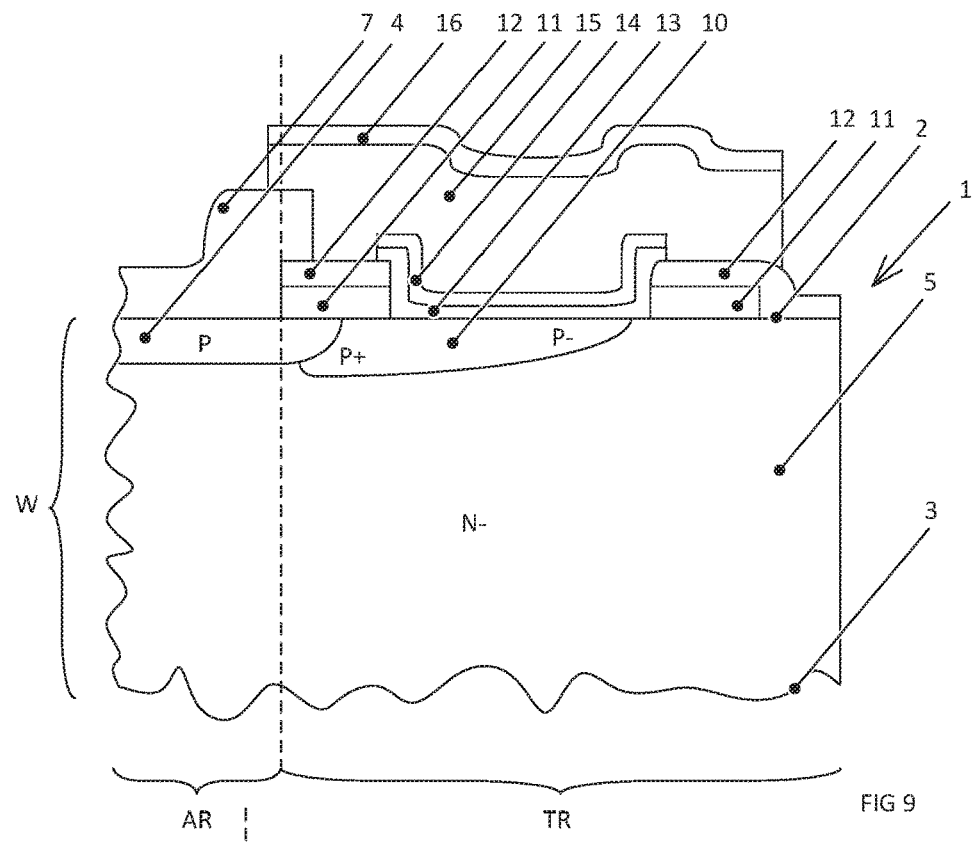

Afterwards, an undoped silicate glass layer 16 is directly formed on the silicon nitride layer, i.e. the layers attach each other (FIG. 9). The USG layer 16 may be formed using the same mask as for the second nitride layer 15 resulting in layers which extend to the same lateral border or the USG layer 16 may be created such that it covers the second nitride layer to its top side (opposite to the wafer \N) and to its lateral sides (i.e. perpendicular to the first main side 2).

On top of the undoped silicate glass layer 16, an organic dielectric layer 17 is formed (FIG. 9). Exemplarily, the organic dielectric layer 17 covers the undoped silicate glass layer 16 to the top and lateral sides.

In exemplary embodiments of the method for manufacturing the power semiconductor device according to the invention the first silicon nitride layer 14 is formed by low pressure chemical vapour deposition or sputtering.

In exemplary embodiments of the method for manufacturing the power semiconductor device according to the invention the second silicon nitride layer 15 is formed by plasma enhanced chemical vapour deposition or sputtering.

In exemplary embodiments of the method for manufacturing the power semiconductor device according to the invention the second silicon nitride layer 15 is created with a layer thickness of at least 0.5 µm or of at least 0.7 µm or of at least 0.9 µm.

In exemplary embodiments of the method for manufacturing the power semiconductor device according to the invention the undoped silicate glass layer 16 is formed by plasma enhanced chemical vapour deposition or sputtering at a wafer temperature below 500° C., exemplarily below 425° C.

In exemplary embodiments of the method for manufacturing the power semiconductor device according to the invention the silicon nitride layer 14, 15 and the undoped silicate glass layer 16 are selectively etched using a same, single masking layer. This ensures that the whole silicon nitride layer is covered by the undoped silicate glass layer 16 to block humidity towards the silicon nitride layer most efficiently.

In the description above, a specific embodiment was described. However, alternatives and modifications of the above described embodiment are possible.

The above embodiments were explained with specific conductivity types. The conductivity types of the semiconductor layers in the above described embodiments might be switched, so that in a specific embodiment all layers which were described as p-type layers would be n-type layers and all layers which were described as n-type layers would be p-type layers. For example, in a modified embodiment, the source layer 5 may be a p-doped layer, the drift layer 5 may be a p-doped layer, and the cathode layer 6 may be a p-doped layer.

It should be noted that the term "comprising" does not exclude other elements or steps and that the indefinite article "a" or "an" does not exclude the plural. Also elements described in association with different embodiments may be combined.

LIST OF REFERENCE SIGNS 1 pin diode
2 first main side
3 second main side
4 (p-doped) anode layer
5 ($n^-$-doped) drift layer
6 ($n^+$-doped) cathode layer
7 anode electrode
8 cathode electrode
10 variation of lateral doping (VLD) region
100 field ring
11 silicon dioxide layer
12 PSG layer
13 semi-insulating layer
14 first silicon nitride layer
15 second silicon nitride layer
16 undoped silicate glass layer
17 organic dielectric layer
18 gate layer (polysilicon)
19 gate contact
50 (n+ doped) source layer
52 field stop layer
70 electrode
AR active region
TR termination region
W semiconductor wafer

The invention claimed is:

1. A power semiconductor device comprising:
a wafer, wherein in a termination region of the device a passivation layer structure is formed at least on a portion of a surface of the wafer,
the passivation layer structure comprises in sequential order from the surface of the wafer in a direction away from the wafer a semi-insulating layer, a silicon nitride layer, an undoped silicate glass layer and an organic dielectric layer,
wherein the silicon nitride layer has a layer thickness of at least 0.5 µm, wherein the organic dielectric layer is directly attached to the undoped silicate glass layer and wherein the undoped silicate glass layer is directly attached to the silicon nitride layer.

2. The power semiconductor device according to claim 1, wherein the silicon nitride layer has a layer thickness of at least 0.7 µm.

3. The power semiconductor device according to claim 1, wherein the silicon nitride layer has a layer thickness of at most 2.0 µm.

4. The power semiconductor device according to claim 1, wherein the undoped silicate glass layer has a layer thickness of at least 0.4 µm.

5. The power semiconductor device according to claim 1, wherein the organic dielectric layer includes at least one of a polyimide layer, a polybenzoxazole layer and a silicone layer.

6. The power semiconductor device according to claim 1, wherein the semi-insulating layer is a semi-insulating polycrystalline silicon layer, an amorphous silicon layer, an amorphous silicon nitride or a diamond-like carbon layer.

7. The power semiconductor device according to claim 1, wherein the wafer is made of silicon or of a wide bandgap material or of silicon carbide.

8. A method for manufacturing a power semiconductor device, the power semiconductor device comprising a wafer, the method comprising the following steps:
forming a passivation layer structure in a termination region of the device on at least a portion of a surface of the wafer, wherein the step of forming the passivation layer structure includes a step of forming a semi-insulating layer, a step of forming a silicon nitride layer on the semi-insulating layer, a step of forming an undoped silicate glass layer on the silicon nitride layer and a step of forming an organic dielectric layer on the undoped silicate glass layer,
wherein the silicon nitride layer has a layer thickness of at least 0.5 mu.m and in that the organic dielectric layer is directly attached to the undoped silicate glass layer and in that the undoped silicate glass layer is directly attached to the silicon nitride layer.

9. The method according to claim 8, wherein the step of forming the silicon nitride layer includes a first step of forming a first silicon nitride layer at a temperature above 600° C. and a second step of forming a second silicon nitride layer at a temperature below 425° C.

10. The method according to claim 9, wherein forming the first silicon nitride layer by low pressure chemical vapour deposition.

11. The method according to claim 9, wherein forming the second silicon nitride layer by plasma enhanced chemical vapour deposition.

12. The method according to claim 9, wherein forming the second silicon nitride layer with a layer thickness of at least 0.5 µm.

13. The method according to claim 8, wherein forming the undoped silicate glass layer by plasma enhanced chemical vapour deposition at a temperature below 425° C.

14. The method according to claim 8, wherein selectively etching the silicon nitride layer and the undoped silicate glass layer using a same masking layer.

15. The power semiconductor device according to claim 1, wherein the silicon nitride layer has a layer thickness of at least 0.9 µm.

16. The power semiconductor device according to claim 2, wherein the silicon nitride layer has a layer thickness of at most 2.0 µm.

17. The power semiconductor device according to claim 1, wherein the undoped silicate glass layer has a layer thickness of at least 0.5 µm.

18. The method according to claim 10, wherein forming the second silicon nitride layer by plasma enhanced chemical vapour deposition.

19. The method according to claim 10, wherein forming the second silicon nitride layer with a layer thickness of at least 0.5 µm.

20. The method according to claim 9, wherein forming the undoped silicate glass layer by plasma enhanced chemical vapour deposition at a temperature below 425° C.

* * * * *